US012723350B2

(12) United States Patent
Van Fleet et al.

(10) Patent No.: US 12,723,350 B2
(45) Date of Patent: Sep. 1, 2026

(54) METHOD FOR DISTRIBUTING CHEMICALS IN DELIGNIFICATION STAGES OF PULP BLEACHING PROCESS

(71) Applicant: Andritz Inc., Alpharetta, GA (US)

(72) Inventors: Richard Van Fleet, Alpharetta, GA (US); Ilpo Märkjärvi, Lempäälä (FI)

(73) Assignee: Andritz Inc., Alpharetta, GA (US)

( * ) Notice: Subject to any disclaimer, the term of this patent is extended or adjusted under 35 U.S.C. 154(b) by 384 days.

(21) Appl. No.: 18/488,789

(22) Filed: Oct. 17, 2023

(65) Prior Publication Data

US 2025/0122668 A1 Apr. 17, 2025

(51) Int. Cl.
*D21C 9/10* (2006.01)
*D21C 9/16* (2006.01)
*D21G 9/00* (2006.01)
*G06F 30/20* (2020.01)

(52) U.S. Cl.
CPC .......... *D21C 9/1052* (2013.01); *D21C 9/163* (2013.01); *D21G 9/0018* (2013.01); *G06F 30/20* (2020.01)

(58) Field of Classification Search
CPC ................................................ D21C 9/10–185
See application file for complete search history.

(56) References Cited

U.S. PATENT DOCUMENTS

| | | | | |
|---|---|---|---|---|
| 2,307,137 A | | 1/1943 | Kennedy | |
| 5,030,324 A | * | 7/1991 | Green | D21C 9/147 162/88 |
| 6,153,050 A | | 11/2000 | Savoie et al. | |
| 2005/0034824 A1 | | 2/2005 | Lampela | |

FOREIGN PATENT DOCUMENTS

| | | | | |
|---|---|---|---|---|
| CA | 2319074 C | * | 3/2009 | D21C 5/005 |
| CN | 104652161 B | | 1/2017 | |
| CN | 112908423 B | * | 10/2022 | G16C 20/10 |

(Continued)

OTHER PUBLICATIONS

Zhang et al., Improved Model for Brightness Optimization Control in the First (C95/D5) Bleaching Stage, 2016, BioResources, 11(2), pp. 3660-3678 (Year: 2016).*

(Continued)

*Primary Examiner* — Anthony Calandra
(74) *Attorney, Agent, or Firm* — Myers Bigel, P.A.

(57) ABSTRACT

Methods, systems, and apparatus, including computer programs encoded on a computer storage medium, for determining and applying a distribution of oxidizing agents in delignification of a pulp bleaching cycle. The method obtains an incoming kappa value of an unbleached pulp slurry and a target kappa value expected for a bleached pulp slurry. A model generates a sequence kappa factor based on these values, and a total equivalent chlorine (TEC) factor from the sequence kappa factor and the incoming kappa value. Scenarios are simulated using the TEC factor, each scenario specifying a unique distribution of dosage targets for oxidizing agents and having a total consumption score for the oxidizing agents that is determined based on the dosage targets for the oxidizing agents. A scenario with the lowest total consumption score is selected, and the model applies the dosage targets of oxidizing agents for the selected scenario during the pulp bleaching cycle.

20 Claims, 6 Drawing Sheets

(56) References Cited

FOREIGN PATENT DOCUMENTS

| | | | | | |
|---|---|---|---|---|---|
| EP | 1302589 | A2 * | 4/2003 | | D21C 9/1052 |
| JP | 2013007135 | A * | 1/2013 | | |
| WO | WO-9417238 | A1 * | 8/1994 | | D21C 9/1026 |
| WO | WO-2005042832 | A1 * | 5/2005 | | D21C 9/1052 |

OTHER PUBLICATIONS

Honeywell Process Solutions, Profit Suite for Bleaching, Apr. 2019, Honeywell International (Year: 2019).*

Westerberg, Advanced Process Controlls (APC) for Pulp Mil Proces Control Optimization, 2015, Japan Technology Summit (Year: 2015).*

Gough, W.A., BrainWave: Model Predicative Control for the Process Industries, Jan. 28, 2015 (downloaded online from andritz.com Dec. 2025), Andritz, pp. 393-418. (Year: 2015).*

Van fleet et al., Bleach Load: A New Inline sensor Based improvement for Bleach Plant Advances Control, 2012, Tappi Peers Conference, p. 622-661. (Year: 2012).*

Perala et al., Advanced Sequence Kappa Factor Control Part 1—De Kappa Control, 2001, Tappi Journal, 84(4), p. 1-11. (Year: 2001).*

English machine translation CN112908423B (Year: 2022).*

"International Search Report and Written Opinion corresponding to International Application No. PCT/US2024/047346 mailed Jan. 21, 2025".

Dumont et al., "A setpoint generation tool for optimal distribution of chemical load between bleaching stages," Pulp & Paper Canada, Jul. 2006, 107(7/8):55-57.

* cited by examiner

METHOD FOR DISTRIBUTING CHEMICALS IN DELIGNIFICATION STAGES OF PULP BLEACHING PROCESS

BACKGROUND

This specification generally relates to distributing chemicals using a manufacturing plant's devices.

Manufacturing plants (e.g., pulp or wood fiber processing plants) utilize several different types of chemicals (e.g., caustics, oxidants) to achieve desired characteristics for the output product produced by the manufacturing plant. Manufacturing plants can perform bleaching processes such as delignification to extract lignin from an input product such as wood pulp, thereby bleaching the wood pulp while providing desirable characteristics such as brightness, color, opacity, gloss, strength, flexibility, rigidity, and so on. Delignification can generally include applying different types of chemicals at different processing stages to achieve the desired output product (e.g., bleached wood pulp, delignified wood pulp). Consumption of these chemicals during the delignification process generally calls for careful adjustment as different chemicals react differently, and the chemicals have varying reaction rates that provide inconsistency in overall product quality. Furthermore, achieving the desired bleaching response can be challenging, complex, and expensive, as a combination of chemicals to achieve a desired bleaching response is not guaranteed to be consistent, e.g., repeatable, due to the complex processing and variability performed in delignification.

SUMMARY

In general, one innovative aspect of the subject matter described in this specification can be embodied in methods that can include the actions of obtaining (1) an incoming kappa value that represents a lignin content of an unbleached pulp slurry and (2) a target kappa value that represents an expected lignin content of a bleached pulp slurry; generating, using a model, a sequence kappa factor corresponding to the incoming kappa value and the target kappa value, wherein the model maintains a relationship between a plurality of kappa factors and a plurality incoming and target kappa values; generating, by the model, a total equivalent chlorine (TEC) factor according to the kappa factor and the incoming kappa value; simulating, using the TEC factor, a plurality of scenarios, wherein each scenario in the plurality of scenarios specifies a unique distribution of dosage targets for a plurality of oxidizing agents used during a pulp bleaching cycle; determining, for each scenario and based on the dosage targets for the plurality oxidizing agents corresponding to the scenario, a total consumption score for the plurality of oxidizing agents; selecting, from among the plurality of simulated scenarios and based on the total consumption score determined for the plurality of simulated scenarios, a scenario with a lowest total consumption score; and applying, by the model, the dosage targets of the plurality of oxidizing agents for the selected scenario during the pulp bleaching cycle. Other embodiments of this aspect include corresponding systems, apparatus, and computer programs, configured to perform the actions of the methods, encoded on computer storage devices.

The distribution of oxidants in the delignification process in a pulp bleaching cycle is a complex system that can be inconsistent between multiple bleaching cycles with seemingly similar operating parameters. For example, the lignin load or amount of lignin (e.g., as measured as a Kappa) of an unbleached pulp slurry can vary between pulp bleaching sequences and cycles, and can also vary based on the number of oxidants applied (e.g., distributed by devices of a manufacturing plant) or the number of oxidants consumed (e.g., reactions with the pulp) throughout the bleaching process. An amount of oxidant can be consumed during a chemical reaction without a corresponding reduction in lignin, thereby resulting in oxidant waste (e.g., an extraneous amount of chemical). Other variables that can affect the complexity and overall success rates of the delignification process include time to complete the pulp bleaching cycle, temperature, and ineffectiveness of upstream processes (e.g., processes performed prior to pulp bleaching, such as cooking, oxygen delignification, and washing. Factors such as pH (e.g., acidity, alkalinity), unmeasured disturbance variables (e.g., wood type, age, the prescience of carryover liquor), and lab testing variability can also adversely affect overall delignification success in pulp bleaching cycles.

These and other embodiments can each optionally include one or more of the following features.

In an aspect, the method includes obtaining (1) an incoming kappa value that represents a lignin content of an unbleached pulp slurry and (2) a target kappa value that represents an expected lignin content of a bleached pulp slurry. The method includes generating, using a model, a sequence kappa factor corresponding to the incoming kappa value and the target kappa value. The model maintains a relationship between a plurality of kappa factors and a plurality incoming and target kappa values. The method includes generating, by the model, a total equivalent chlorine (TEC) factor according to the sequence kappa factor and the incoming kappa value. The method includes simulating, using the TEC factor, a plurality of scenarios. Each scenario in the plurality of scenarios specifies a unique distribution of dosage targets for a plurality of oxidizing agents used during a pulp bleaching cycle. The method includes determining, for each scenario and based on the dosage targets for the plurality oxidizing agents corresponding to the scenario, a total consumption score for the plurality of oxidizing agents. The method includes selecting, from among the plurality of simulated scenarios and based on the total consumption score determined for the plurality of simulated scenarios, a scenario with a lowest total consumption score. The method includes applying, by the model, the dosage targets of the plurality of oxidizing agents for the selected scenario during the pulp bleaching cycle.

In some implementations, obtaining the target kappa value includes determining a kappa value for a bleached pulp slurry from an immediately preceding pulp bleaching cycle. The plurality of oxidizing agents can include chlorine dioxide, hydrogen peroxide, and oxygen.

In some implementations, applying the dosage targets of the plurality of oxidizing agents for the selected scenario during the pulp bleaching process includes applying the dosage target for chlorine dioxide during a first stage of the pulp bleaching cycle. The method also includes applying the dosage targets for hydrogen peroxide and oxygen during a second stage of the pulp bleaching cycle.

In some implementations, determining the total consumption score of the plurality of oxidizing agents includes determining a total economic cost of the plurality of oxidizing agents. In some implementations, the method includes determining a first kappa value of a bleached pulp slurry after the second stage of a pulp bleaching cycle and assigning the first kappa value as a target kappa value for a next pulp bleaching cycle. In some implementations, applying the dosage targets of the plurality of oxidizing agents for the selected scenario during the pulp bleaching cycle includes controlling a first valve to release into the pulp slurry the dosage target for chlorine dioxide during the first stage of the pulp bleaching cycle. The method also includes controlling a second valve and a third valve to release the dosage targets for hydrogen peroxide and oxygen during the second stage of the pulp bleaching cycle.

In some implementations, the method includes obtaining the incoming and target kappa values includes determining, using a plurality of kappa sensors, the incoming and target kappa values. In some implementations, the model is configured to determine the TEC factor by determining dosage targets for the plurality of oxidizing agents that maximizes delignification of the unbleached pulp slurry and minimize consumption of the plurality of oxidizing agents.

In an aspect, a system including one or more memory devices storing instructions; and one or more data processing apparatus that are configured to interact with the one or more memory devices, and upon execution of the instructions, perform operations. The operations include obtaining (1) an incoming kappa value that represents a lignin content of an unbleached pulp slurry and (2) a target kappa value that represents an expected lignin content of a bleached pulp slurry. The operations also include generating, using a model, a sequence kappa factor corresponding to the incoming kappa value and the target kappa value, wherein the model maintains a relationship between a plurality of kappa factors and a plurality incoming and target kappa values. The operations include generating, by the model, a total equivalent chlorine (TEC) factor according to the sequence kappa factor and the incoming kappa value and simulating, using the TEC factor, a plurality of scenarios, wherein each scenario in the plurality of scenarios specifies a unique distribution of dosage targets for a plurality of oxidizing agents used during a pulp bleaching cycle. The operations include determining, for each scenario and based on the dosage targets for the plurality oxidizing agents corresponding to the scenario, a total consumption score for the plurality of oxidizing agents. The operations include selecting, from among the plurality of simulated scenarios and based on the total consumption score determined for the plurality of simulated scenarios, a scenario with a lowest total consumption score, and applying, by the model, the dosage targets of the plurality of oxidizing agents for the selected scenario during the pulp bleaching cycle.

In an aspect, a non-transitory computer readable medium storing instructions that, when executed by one or more data processing apparatus, cause the one or more data processing apparatus to perform operations. The operations include obtaining (1) an incoming kappa value that represents a lignin content of an unbleached pulp slurry and (2) a target kappa value that represents an expected lignin content of a bleached pulp slurry. The operations also include generating, using a model, a sequence kappa factor corresponding to the incoming kappa value and the target kappa value, wherein the model maintains a relationship between a plurality of kappa factors and a plurality incoming and target kappa values. The operations include generating, by the model, a total equivalent chlorine (TEC) factor according to the sequence kappa factor and the incoming kappa value and simulating, using the TEC factor, a plurality of scenarios, wherein each scenario in the plurality of scenarios specifies a unique distribution of dosage targets for a plurality of oxidizing agents used during a pulp bleaching cycle. The operations include determining, for each scenario and based on the dosage targets for the plurality oxidizing agents corresponding to the scenario, a total consumption score for the plurality of oxidizing agents. The operations include selecting, from among the plurality of simulated scenarios and based on the total consumption score determined for the plurality of simulated scenarios, a scenario with a lowest total consumption score, and applying, by the model, the dosage targets of the plurality of oxidizing agents for the selected scenario during the pulp bleaching cycle.

Particular embodiments of the subject matter described in this specification can be implemented to realize one or more of the following advantages. As described in this specification, chemical reactions that occur when a pulp slurry undergoes delignification can be complex with multiple sources of variability. Delignification involves adding dosages of oxidants throughout the bleaching process to reduce lignin content (e.g., by reacting with the dosages of oxidants) in an unbleached pulp slurry, thereby achieving a desired kappa (e.g., the amount of lignin) for a bleached pulp slurry. The present innovations rely on a method of applying oxidants throughout the bleaching stages of a bleaching process, by optimizing a total equivalent chlorine (TEC) factor representing the overall bleaching power of all of the oxidants used in a delignification process. The use of simulations and modeling in determining unique distributions of chemical dosages and timing controls for the chemical dosages to be applied provide an optimization that can be obtained by minimizing a total consumption score for the target TEC factor to bleach the unbleached pulp slurry.

This specification describes techniques that utilize sensors (e.g., flow meters, optical sensors or chemical concentration sensors) dispersed through a manufacturing plant (e.g., on or around different plant devices) to collect data. The data can be related to the pulp slurry as chemicals are applied in the bleaching process of the manufacturing plant, as well as data characterizing reactions of chemicals applied to the lignin content of the pulp slurry throughout the bleaching stages. The collected sensor data can be processed, analyzed, and aggregated by delignification controls, TEC controls, and caustic-to-TEC ratio controls that provide a holistic assessment of oxidant effectiveness. These controls can provide those fewer residuals (e.g., unconsumed chemicals at the end of the chemical reaction) of oxidants and caustics remain, as residuals are waste products that often cannot be re-used in later bleaching stages. Furthermore, the present innovations provide that a precise dosage and timing of dosages of chemicals can be applied such that efficient chemical reactions between the chemicals and lignin of a pulp slurry can be captured.

As an example, the dosages target, and dosage timing can be optimized to use the minimal dosages to achieve a target kappa and corresponding TEC factor for a bleached pulp output to avoid overconsumption or underutilization of chemicals. As another example, the optimal dosage targets and dosage timing can provide shorter chemical reaction times compared to dosage targets and timing that can prolong chemical reaction times. Adding more dosages or large amounts of dosages at any time of the bleaching process may not increase chemical reaction rates (e.g., time to complete a chemical reaction) to oxidize lignin content in a pulp slurry. The techniques described in this specification provide that the optimal dosages and timing increase reaction efficiency, without overconsumption or distribution of the oxidants utilize in delignification (and thereby achieve resource-efficient processing).

Further still, the techniques described in this specification can make adjustments to delignification in a manufacturing plant (e.g., adjustments to dosages and dosage timing provided by one or more plant devices) in a manner that results in the plant or the device's operational and/or manufacturing outputs being maintained or improved, in comparison to conventional techniques. Conventional techniques for delignification control in a manufacturing plant generally are not able to identify opportunities to add precise amounts (e.g., without waste) of oxidants at delayed timings to capture optimal reaction rates between the oxidants and lignin in the pulp input at individual stages of bleaching processes. In addition, conventional techniques fail to capture varying distributions of oxidants with a total equivalent chlorine factor for achieving a particular or target kappa for an output product. In contrast, the techniques described in this specification achieve the target kappa for the bleached pulp output by performing various simulations that utilize information about the current and forthcoming conditions to identify and adjust the controls for different plant devices in a manner that achieves the target kappa. The target kappa for the bleached output after delignification controls, TEC controls, and caustic controls can be provided using the TEC factor of the distributed oxidants and caustics without overapplication or underutilization. As a result, the techniques described in this specification can simulate distributions of dosage targets for the plant's operations for different delignification scenarios, e.g., different sensor measurements and kappa values throughout the bleaching process. A scenario with the least total consumption score can be identified and the scenario's corresponding distribution of oxidants and caustics (e.g., dosage targets) can be applied at the determined dosage timings during the pulp bleaching cycle.

By minimizing the overall usage of the total amount of oxidants, and spreading the amount of oxidants used more evenly, many fiber strength parameters can be preserved. These include viscosity, burst, and tensile strength, among others. The least total consumption score and corresponding distribution can achieve precise bleaching conditions to achieve desired fiber properties without damaging stitching, e.g., interstitial bonding between molecules of compounds. The techniques described in this specification also provide that bleaching devices can operate for short periods of time to generate an amount of paper, due to the reductions in chemical waste and overconsumption. Increased operational efficiency of mills to produce paper products improving production efficiency can result in lower carbon emissions and reduce chemical waste, mitigation some effects of the environmental impact when producing paper products from mills. The quality of product can be maintained without overconsumption of chemicals by utilizing the least total consumption score and corresponding chemical distribution, thereby resulting in lower likelihoods of producing unusable paper product, e.g., overbleached pulp.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
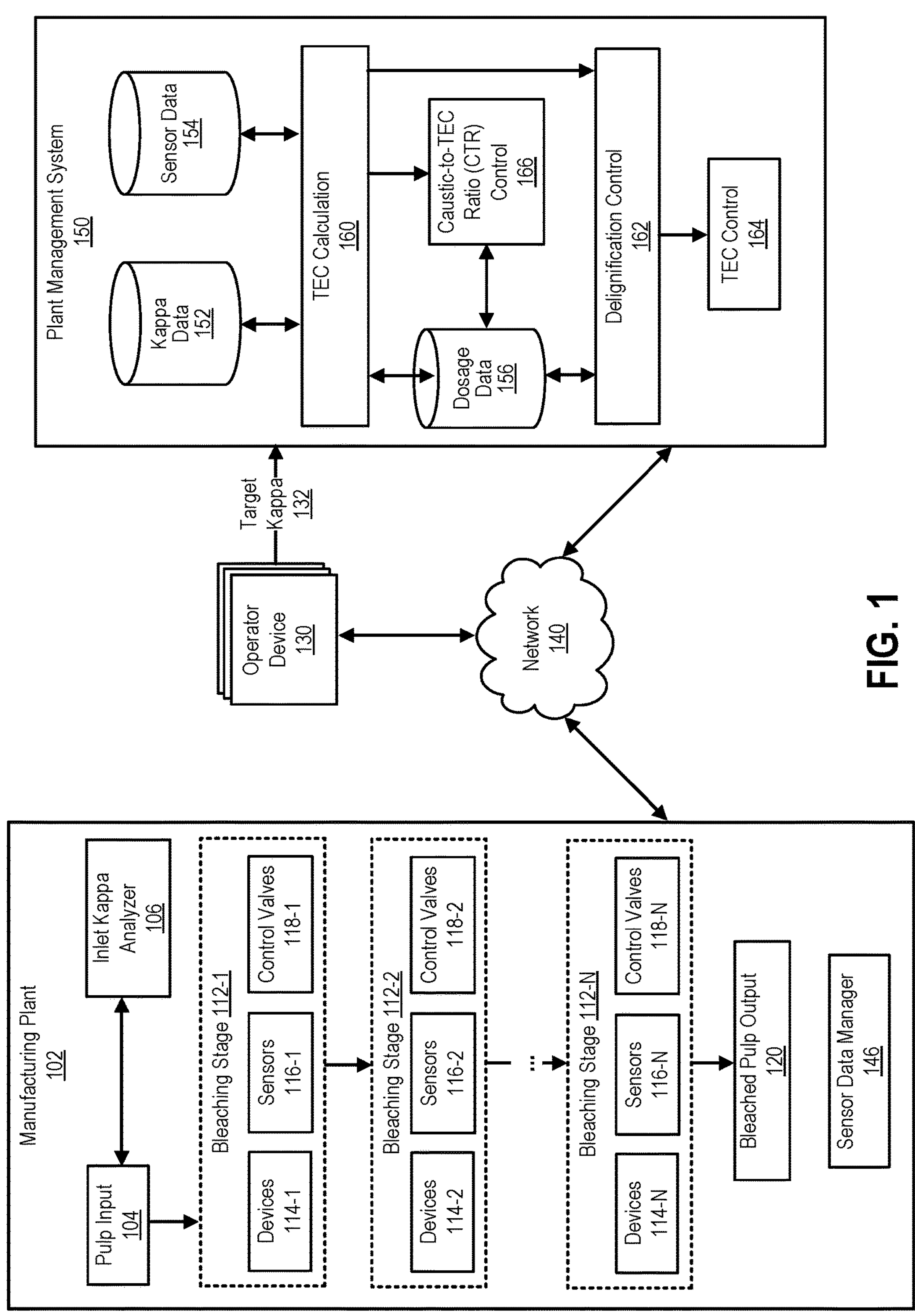
FIG. 1 is a block diagram of an example environment for adjusting chemical distributions in a bleaching process of a manufacturing plant.

This document generally relates to techniques for determining the optimal distribution of chemicals applied during a manufacturing plant's delignification process based on simulations and modeling that utilize the consumption of chemicals and sequence kappa factor. A model can generate a kappa factor based on an input value for the kappa of an unbleached pulp slurry prior to a delignification process, and a target value for the kappa of the bleached pulp slurry output after the delignification process. A simulator can perform numerous simulations of applying chemicals to determine an optimal distribution that includes the dosages and dosage timings to achieve and maintain a particular kappa throughout the stages of the delignification process.

A kappa (also referred to as a "kappa number") generally describes the lignin content (e.g., an amount of lignin) of a pulp slurry, in which a manufacturing plant can perform delignification to remove lignin without compromising other physical properties (e.g., brightness, stock quality) of the pulp slurry that are expected for paper products. A sequence kappa factor describes the total equivalent chlorine dosage of all of the oxidants applied in a number of bleaching stages prior to a final bleaching stage, relative to the kappa of the pulp slurry, e.g., that undergoes the number of bleaching stages in a bleaching process. In some implementations, a sequence kappa factor refers to a percentage of the total equivalent chlorine applied throughout a bleaching process, divided by a kappa describing the lignin content of a pulp slurry.

As described in this specification, the optimal distribution of chemicals can include determining appropriate amounts (e.g., dosages) of a chemical at a particular point (e.g., timing in a stage, timing at multiple stages) in the bleaching process to achieve a target total equivalent chlorine (TEC) factor that correlates with a target sequence kappa factor for the output product. The model (e.g., a trained machine learning model or another appropriate statistical model) can learn relationships between an input sequence kappa factor for an unbleached pulp slurry and the target kappa factor for a bleached pulp slurry that is generated after the unbleached pulp slurry undergoes a bleaching process performed by a manufacturing plant. In addition to the model, the simulator (e.g., that can also be model-based) can run simulations of scenarios to identify different distributions (e.g., dosages, and timings to apply the dosages) of chemicals to be added during the different stages of the delignification process that achieves a lowest total consumption score, while maintaining the same TEC (e.g., to achieve the target kappa factor for the output product).

The delignification process performed by a manufacturing plant includes using chemicals to oxidize an amount of lignin in a slurry of unbleached pulp. Applying the chemicals (also referred to as oxidants, oxidizing agents, or oxidizers) to bleach the unbleached pulp slurry results in a bleached slurry product that can be further processed for paper products (e.g., and other applications of wood pulp). A manufacturing plant can use many different types of oxidants, including chlorine dioxide, hydrogen peroxide, and allotropes of oxygen such as dioxygen and ozone. With many different types of oxidants used in the delignification process, the total chemical consumption of a manufacturing plant to perform bleaching operations can be characterized in terms of active chlorine, e.g., TEC. A model of the manufacturing plant can determine relate the TEC as a percentage relative to an amount of lignin for an unbleached pulp slurry (e.g., unbleached kappa), to determine a kappa factor, e.g., an amount of the pulp slurry that is oxidized and therefore an amount of lignin that is removed.

The chemicals applied during the delignification process can be categorized by the purpose of application (e.g., to oxidize, to bleach, to brighten) performed on a wood pulp product. For example, combinations of oxidants can be used in the bleaching stages to remove the lignin and the combination of oxidants can have an effective bleaching power, e.g., total equivalent chlorine factor. The total equivalent chlorine factor can be a value that compares the bleaching power to an effective oxidizer, such as chlorine (e.g., generally not used in bleaching due to environmental concerns associated with chlorine use). The TEC factor can be used to measure and compare oxidizing abilities of individual oxidizing agents (i.e., oxidants) during the delignification process.

The TEC factor can be determined by measuring (e.g., using sensors) molecular weights of chemicals and using the number of electrons transferred per molecule of the oxidant to (e.g., a known quantity for each oxidant) to determine the number of equivalent electrons transferred per molecule. Dividing the number of equivalent electrons in chlorine by the number of equivalent electrons transferred per molecule of oxidant provides a relationship between the oxidant and chlorine (e.g., the target bleaching power to be mimicked by other kinds of oxidants). In other words, an oxidant can be described using (1) a first value representing one kilogram of the oxidant in kilograms per chlorine, and (2) a second value representing actual consumption of the oxidant during delignification in kilograms per air-dry tonnes of pulp product. The first and second values can be multiplied to determine consumption as total equivalent chlorine for the respective oxidants, which can be summed across all oxidants in delineation to determine TEC (in kilograms per air-dry tonne of pulp product, or kg/adt). As an example, chlorine (e.g., $Cl_2$) can have a molecular weight of 71 grams per mole and transfers two electrons per molecule when reacting, and therefore provides 35.5 electrons in a kilogram of chlorine applied as an oxidant. Chlorine dioxide (e.g., $ClO_2$) can have a molecular weight of 67.5 grams per mole and transfer five electrons per molecule when reacting, providing approximately 13.5 equivalent electrons. By dividing the 35.5 equivalent electrons transferred by chlorine, by the 13.5 equivalent electrons transferred by chlorine dioxide, approximately 2.63 kilograms of chlorine dioxide can provide the bleaching power of 1 kilogram of chlorine. As an example, the TEC can be determined for four oxidants such as chlorine dioxide, oxygen, ozone, and hydrogen peroxide, with corresponding consumption relationships to active chlorine of 2.63 kg/$Cl_2$, 4.44 kg/$Cl_2$, 4.44 kg/$Cl_2$, and 2.09 kg/$Cl_2$, respectively. For an actual consumption of 10 kg/adt, 1 kg/adt, 1 kg/adt, and 1.5 kg/adt respectively, the four oxidants would have respective consumptions as TEC of 26.3 kg/adt, 4.44 kg/adt, 4.44 kg/adt, and 3.1 kg/adt. The TEC of a manufacturing plant described in this example would be the sum of the respective consumptions as TEC in kg/adt, or approximately 38.3 kg/adt in the bleaching process.

Although the TEC for two different instances of a bleaching process from a manufacturing plant can be similar, one instance of bleaching illustrates different consumption rates of oxidants and therefore calls for different distributions of oxidants for effective bleaching. For example, a first instance and a second instance of a bleaching process can both achieve a TEC of 36 kg/adt. In the first instance of a bleaching process, the manufacturing plant can apply 21 kg/adt of chlorine dioxide and 15 kg/adt of hydrogen peroxide in a bleaching process. The manufacturing plant can have an actualized consumption of 7.98 kg/adt of chlorine dioxide and 7.18 kg/adt of hydrogen peroxide in the first instance. In the second instance of a bleaching process, the manufacturing plant can apply 19 kg/adt of chlorine dioxide and 17 kg/adt of hydrogen peroxide. The manufacturing plant can have an actualized consumption of 7.22 kg/adt of chlorine dioxide and 8.13 kg/adt of hydrogen peroxide in the second instance. Although both instances achieve a TEC of 36 kg/adt, the second instance achieves the TEC using less distributed chlorine dioxide and more hydrogen peroxide. This can be advantageous, as the amounts of chlorine dioxide and hydrogen peroxide distributed in the second instance can result in efficient delignification of an unbleached pulp slurry. As another example, the costs (e.g., financial, environmental) associated with chlorine dioxide can be more expensive than hydrogen peroxide, and so the second instance results in achieving the same TEC using a less expensive distribution of chemicals.

Table 1 (shown below) depicts different types of chemical and their respective properties such as molecular weights, number of electrons transferred per molecule, equivalent electrons, and equivalent electrons to chlorine:

TABLE 1

| Chemical | Molecular Weight (g/mol) | e- transferred per molecule | equivalent e- | 1 kg of chemical (kg/$Cl_2$) |
|---|---|---|---|---|
| $Cl_2 + 2e = 2\ Cl^-$ | 71 | 2 | 35.5 | 1 |
| $ClO_2 + 2\ H_2O + 5e = Cl^- + 4OH$ | 67.5 | 5 | 13.5 | 2.63 |
| $O_2 + 2\ H_2O + 4e = 4\ OH^-$ | 32 | 4 | 8 | 4.44 |
| $O_3 + 3\ H_2O + 4e = 6\ OH^-$ | 48 | 6 | 8 | 4.44 |
| $H_2O_2 + 2\ H^+ + 2e = 2\ H_2O$ | 34 | 2 | 17 | 2.09 |

Table 2 (shown below) depicts the total equivalent chlorine as factor, e.g., a relationship between a chemical and its consumption as active chlorine.

TABLE 2

| Chemical | Total Equivalent Chlorine Factor |
|---|---|
| Chlorine Dioxide | 2.63 |
| Oxygen | 4.44 |
| Ozone | 4.44 |
| Hydrogen Peroxide | 2.09 |

FIG. 1 illustrates an example environment 100 for adjusting chemical distributions in a bleaching process of a manufacturing plant.

The example environment 100 includes a network, such as a local area network (LAN), a wide area network (WAN), the Internet, a mobile network, or a combination thereof. The network 140 connects a plant management system 150, one or more operator devices 130, and one or more manufacturing plants 102. Although the below description describes a single manufacturing plant 102 being controlled/monitored by the plant management system 150, in some implementations, multiple manufacturing plants 102 can be controlled/monitored by the plant management system 150.

A manufacturing plant 102 (also referred to as "pulp processing plant 102") of the environment 100 can be configured to perform delignification operations to bleach pulp. The pulp processing plant 102 obtains a pulp input 104 that can be processed by a number of bleaching stages 112-1-112-N (collectively referred to as bleaching stages 112) to achieve a bleached pulp output 120. For example, a pulp input 104 can be provided to an input to a first bleaching stage 112-1, which then generates a pulp output that can be an input for the next bleaching stage 112-2, until a bleached pulp output 120 is achieved. The bleaching stages 112-1-112-N include respective devices 114-1-114-N ("devices 114"), sensors 116-1-116-N ("sensors 116"), and control valves 118-1-118-N ("control valves 118"). For example, a first bleaching stage 112-1 is illustrated with respective devices 114-1, sensors 116-1, and control valves 118-1, while a second bleaching stage 112-2 is illustrated with respective devices 114-2, sensors 116-2, and control valves 118-2, and so on. Any number of bleaching stages can be performed in pulp processing plant 102 for delignification, and any number of respective devices, sensors, and control valves can be implemented in a respective bleaching stage.

Each of the bleaching stages 112 can be configured to receive a flow of the pulp input 104 (e.g., a pulp slurry), measure properties of the pulp input 104 using respective sensors 116 and add chemicals such as oxidants or caustics by the respective devices 114 of the bleaching stage. The devices 114 can include bleaching equipment (e.g., machines) such as screw conveyors, vacuum drum washers, double roll mixers, pulp chemical mixers, bleaching towers, etc. Other examples of equipment for devices 114 can include washer vats, flow towers, pumps, and ring dilution mechanisms. Sensors 116 can include optical sensors to measure brightness of pulp throughout the delignification process. Additional examples of sensors 116 can include kappa sensors, chemical concentration sensors, and residual concentration sensors, that capture measurements from the flow of pulp. In some implementations, sensors 116 include pH sensors to measure the pH of pulp input and output through each bleaching stage 112. Sensors 116 can include magnetic flow meters to measure flow rates of pulp, and can also include conductivity sensors to measure the conductivity to the pulp flow. In some implementations, sensors 116 can include near-infrared sensors to measure moisture content and estimate pulp brightness, e.g., through IR measurements.

The control valves 118 for each bleaching stage 112-1-112-N can be used to adjust the operations of the respective devices 114, e.g., by allowing varying amounts (e.g., flow rates) of different chemicals to be added by the devices. A respective set of sensors 116-1-116-N and control valves 118-1-118-N can be included (i.e., on the device or in its vicinity) with the corresponding devices 114-1-114-N. Furthermore, data from the sensors 116 can be transmitted via a communication interface (such as Bluetooth or other nearfield communication interface) to a sensor data storage 154 of the plant management system 150 (which can include a wireless gateway). In some implementations, a data acquisition device designed for manufacturing plant electrical standards, e.g., 4-20 mA electrical standards, provides an interface between the sensors 116 and sensor data storage 154. A sensor data manager 146 consolidates the sensor data received from the different sensors 116 and then transmits this consolidated sensor data to the plant management system 150.

Each of the bleaching stages 112-1-112-N can be configured to add oxidants to reduce the lignin content of a pulp input 104 to generate a bleached pulp output 120 with a target amount of lignin (e.g., target kappa factor). The devices 114 of the bleaching stages 112 can include a machine that adds oxidants, with respective control valves 118 to adjust an amount of oxidant being added to the pulp input 104 as the pulp input 104 is being processed. Throughout the bleaching process, the sensors 118 can collect data that includes measurements for flow rates, weights, chemical compositions, and pH values (e.g., describing the acidity or alkalinity of the pulp slurry) of the pulp input 104 at a particular bleaching stage. The control valves can also be configured to adjust an amount of caustic being added to the pulp input 104 by the machines of the respective device 114.

The pulp processing plant 102 also includes an inlet kappa analyzer 106 that determines an inlet kappa value for the pulp input 104 prior to pulp processing plant 102 performing delignification of the pulp input 104. The inlet kappa analyzer 106 can also provide a kappa factor corresponding to the inlet kappa value for the pulp input 104, to be provided to the plant management system 150. In some implementations, the inlet kappa analyzer 106 can provide additional data related to the pulp input 104 such as the production rate (e.g., a rate based on the consistency and mass of the pulp, and the mass of suspension material other than the pulp).

The plant management system 150 can configure operation of the pulp processing plant 102 by providing dosage targets for chemicals applied throughout the delignification of pulp input 104 (further described in FIGS. 2-4 below). The plant management system 150 is also configured to receive a target kappa 132 from the operator device 130 (e.g., directly from the operator device or by network 140).

The operator device 130 is an electronic device that an operator of the pulp processing plant 102 can use to provide the target kappa 132 as an input for the plant management system 150. The plant management system 150 can optimize the bleaching operations (e.g., adjusting distributions of oxidants) in any number of ways to achieve the target kappa 132, regardless of the inlet kappa measured for the pulp input 104 by inlet kappa analyzer 106. In some implementations, the target kappa 132 can be adjusted (e.g., by an operator, in response to a sensor measurement) to a different value by the operator device 130. For example, a value for target kappa 132 can be adjusted based on the type of wood use to generate pulp input 104.

The operator device 130 can also be used by an operator of the pulp processing plant 102 to access operations of the plant and generate reports based on data. For example, the operator device 130 can provide reports showing distributions of chemicals applied by devices the pulp processing plant 102 for a particular scenario (e.g., with the lowest consumption of chemicals that achieves a particular target kappa 132), as determined upon running simulations (which is further described below). As another example, the operator device 130 can provide reports showing various scenarios, their respective chemical distributions, and their respective consumption scores to achieve the same value target kappa 132. Example operator devices 130 include personal computers, tablet devices, mobile communication devices, digital assistant devices, augmented reality devices, and other devices that can send and receive data over the network 140. An operator device 130 typically includes a user application, such as a web browser, to facilitate the sending and receiving of data over the network 140, but native applications executed by the user device 130 can facilitate the sending and receiving of content over the network 140.

As the inlet kappa measured for the pulp input 104 can vary from bleaching a pulp input 104 (e.g., an unbleached pulp slurry) to another pulp input 104, the plant management system 150 can use the target kappa 132 to apply chemicals proportionally to the amount of lignin entering a particular bleaching stage (e.g., of bleaching stages 112). For example, the plant management system 150 can use the target kappa 132 to determine a percentage or an amount of TEC (e.g., in kilograms per air-dried metric tons of wood pulp) that can be distributed (e.g., added) to a bleaching stage. The plant management system 150 can provide the target kappa 132 to a delignification control 162 to run simulations and identify scenarios with combinations of oxidants that apply the target TEC to achieve the target kappa 132. The target kappa 132 can be selected to minimize an amount of wasted chemical (e.g., remaining oxidant), minimizing a type of oxidant used and improving oxidation efficiency (e.g., by providing an amount of oxidant that reacts the fastest). As another example, the target kappa 132 can also be optimized to improve oxidation quality (e.g., providing an amount of oxidant that maintains a bleached output with a kappa factor closest to the target kappa 132).

As an example, an average chemical dosage/consumption of chlorine dioxide at 23.8 kg/adt can be a result of a first stage of a bleaching process. A second stage of a bleaching process can include 12 kg/adt of oxygen consumed and 2.7 kg/adt of hydrogen peroxide consumed, on average. FIG. 3 below depicts an example of calculations to describe chemical application rates as TEC:

TABLE 3

| Chemical | 1 kg of chemical (kg/Cl2) | Actual consumption (kg/adt) | Consumption as TEC (kg/adt) |
|---|---|---|---|
| $Cl_2$ | 1 | 0 | 0 |
| $ClO_2$ | 2.63 | 23.8 | 62.6 |
| $O_2$ | 4.44 | 12 | 53.3 |
| $H_2O_2$ | 2.09 | 2.7 | 5.6 |
| | TOTAL | | 121.5 |

A total consumption of 121.5 kg/adt from the manufacturing plant 102 can be achieved through different distributions of chemicals for delignification. A target kappa 132 can be derived from the TEC determine distributions of the chemicals that minimize overconsumption of one type of chemical in favor of another that can achieve the target kappa. Different percentages of chemicals can be determined based on an average expected unbleached kappa, the target kappa 132, physical constraints of equipment utilizing in delignification, and reaction constraints or considerations for different types of chemicals. A minimization of lignin at the end of the delignification process can be achieved to supplement any brightening stages that occur in paper production e.g., improved brightening efficiency and reduced variability in final product quality targets.

The target kappa 132 can also be optimized to achieve a kappa factor that compensates for errors in other stages of pulp processing that occur prior to bleaching stages 112 (e.g., pulp washing). A kappa factor (e.g., kappa number inversely related to brightness) of pulp slurry inputs to the manufacturing plant 102 can achieve a target kappa 132 through different types of distributions and applications of delignification control. A number of bleaching stages (e.g., three stage, four stage, and five stage configurations for bleaching plants) can perform delignification of pulp slurry inputs to achieve a desired kappa for a type of paper product. Furthermore, the delignification control 162 determines consumption scores in the simulations to determine a scenario with the lowest consumption score and selects oxidant distributions and timing of the oxidant distributions associated with the determined scenario. In some implementations, one type of oxidant can be more environmentally harmful than another type of oxidant, and therefore the delignification control 162 can identify a scenario in which a type of oxidant is minimized and achieving the target kappa 132 while maintaining an overall total consumption score that is relatively low. The consumption score can be based on physical constraints of the equipment utilized in the delignification process. Additionally, the consumption score can be based on reaction limitations of different types and distributions of chemicals applied, e.g., capacity to remove lignin.

Generally, the target kappa 132 is used by the delignification control 162 to determine an amount of oxidant to be added based on an input amount of lignin in a respective bleaching stage. Additionally, the plant management system 150 includes kappa data 152, which can store input kappa values from an inlet kappa analyzer 106 but can also include historical values (e.g., for input kappa, target kappa, output kappa) from previous bleaching cycles. The kappa data 152 can include other values such as kappa factors across various scenarios simulated by the delignification control 162.

Figure 4:
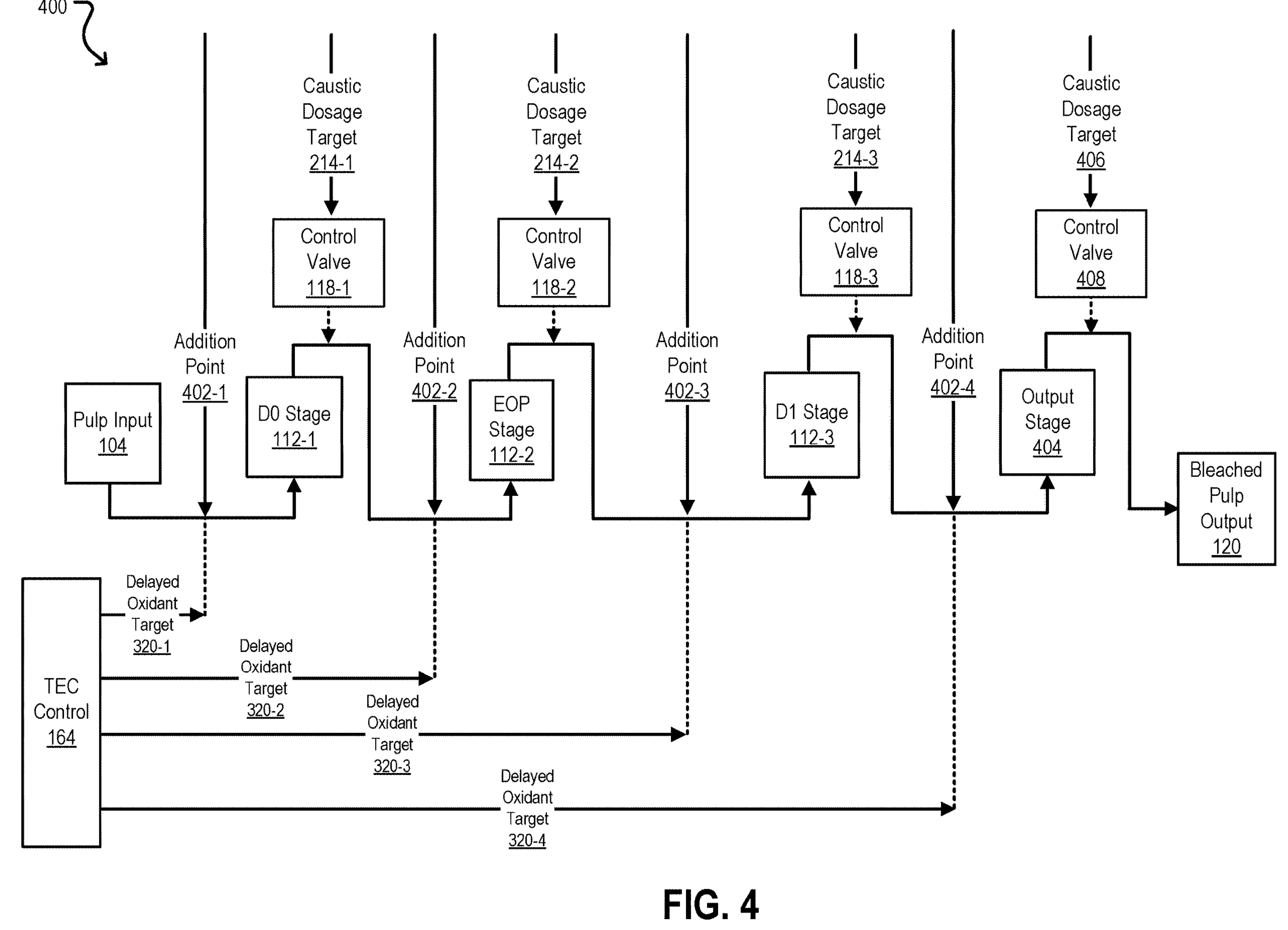
FIG. 4 is a block diagram illustrating a distribution of dosage targets for oxidizing agents from the example scenario that has a lowest consumption score.

The plant management system 150 includes a TEC calculation 160 that can compute a predicted TEC and a delayed TEC for the delignification control 162 using a model (further described in FIG. 4). For example, the TEC calculation 160 can use measurements from sensor data 154 to determine a value expected for TEC based on the sensor measurements that can indicate amounts of oxidant consumed, for each type of oxidant used in the bleaching stage. The TEC calculation 160 provides the predicted TEC and delayed TEC for the delignification control 162 to generate a TEC dosage target, e.g., a dosage value of bleaching power that oxidants should produce to achieve the value for target kappa 132 for a bleached output pulp 120. The TEC calculation 160 and the delignification control 162 can store dosage targets (e.g., for TEC, respective oxidants, and caustics) in dosage data 156. For example, a percentage representing an actual load of oxidants in previous pulp bleaching operational cycles can be stored in dosage data 156 that can be paired with kappa factors. The dosage data 156 can also include dosage target data that describes target percentages for each oxidant, to achieve the target TEC without incorrect or resource inefficient consumption of oxidants (e.g., adding too much or too little of an oxidant).

The delignification control 162 provides the TEC dosage target to TEC control 164, which determines appropriate dosages and timing to distribute dosages in a bleaching cycle for each oxidant. The process of determining dosage target amounts and timing is described in FIGS. 3 and 4 below. In some implementations, the TEC control 164 can determine dosages of the respective oxidants and timing for dosages based on historical data stored in kappa data 152 and sensor data 154.

The TEC calculation 160 also provides values (e.g., model-based) for predicted TEC and delayed TEC values to Caustic-to-TEC Ratio (CTR) Control 166. The CTR control 166 of the plant management system 150 can determine appropriate amounts of caustics (e.g., sodium hydroxide) based on measured pH values, e.g., measurements of sensors 116 used throughout the bleaches stages 112 when the pulp processing plant 102 perform delignification. The CTR control 166 of the plant management system 150 can distribute dosages of caustics at various addition points of a bleaching process to achieve a target pH for the bleached pulp output 120.

Figure 2:
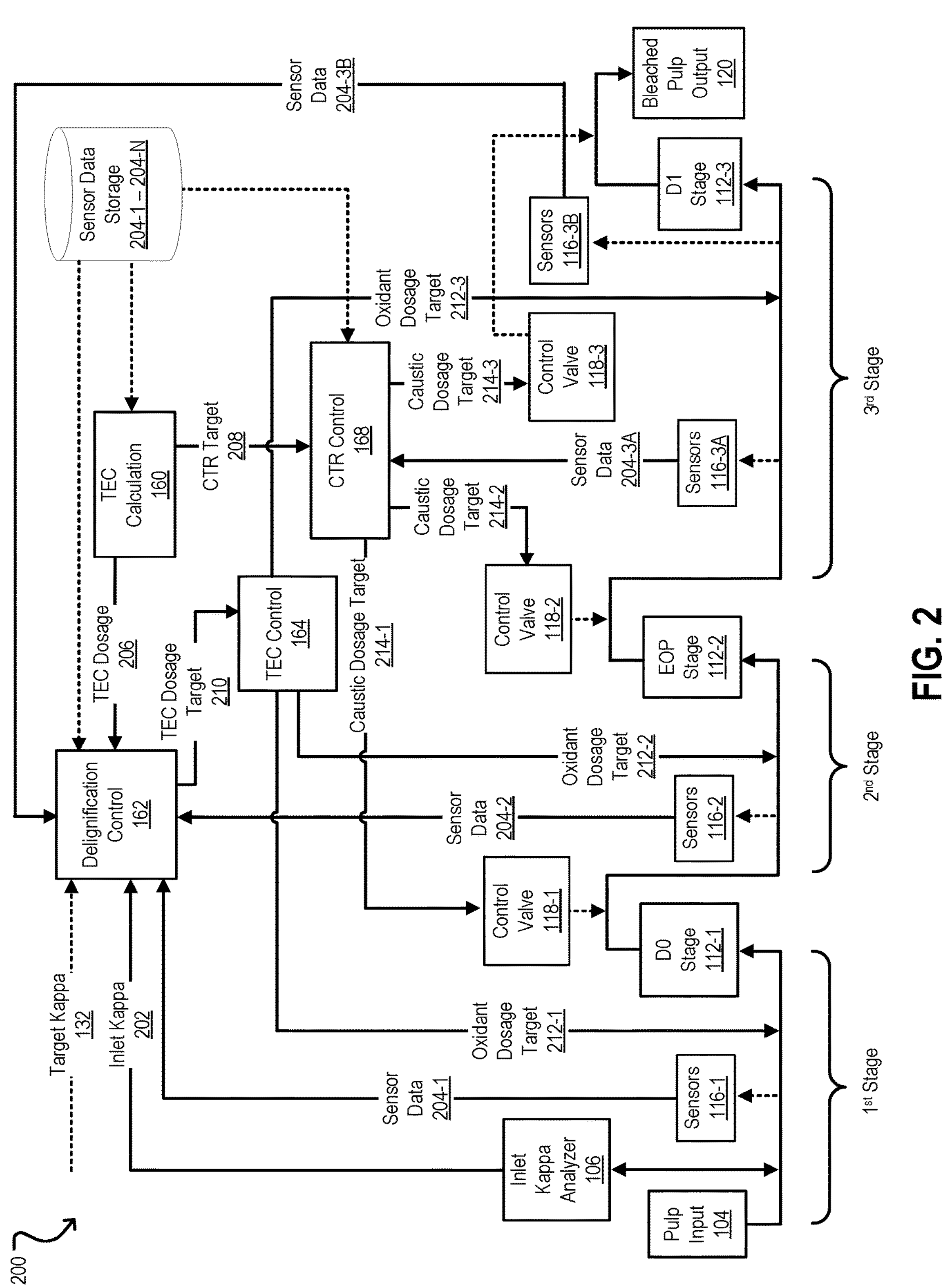
FIG. 2 is a block diagram illustrating the components of FIG. 1 that operate together to determine chemical distribution adjustments based on a TEC factor.

FIG. 2 is a block diagram illustrating the components of FIG. 1 that operate together to determine chemical distribution adjustments based on a TEC factor. Bleaching process 200 is a three stage process for bleaching pulp input 104 (e.g., by a pulp processing plant 102) with target dosages applied to the pulp slurry as it flows from one stage to the following stage. For example, the oxidant dosage targets 212-1, 212-2, and 212-3 can be added by TEC control 164 at a first stage, a second stage, and a third stage (collectively referred to as bleaching stages 112), during the bleaching process 200. Caustic dosage targets 214-1, 214-2, and 214-3 can be added by CTR control 168 during the bleaching process 200, by control valves 118-1, 118-2, and 118-3, respectively. As an example, a chemical distribution can include first stage application of chlorine dioxide, followed by a second stage application of hydrogen peroxide e.g., an oxidative extraction stage, follow by a third stage application chloride dioxide, e.g., a brightening stage. The pulp input 104 can be an unbleached pulp slurry that flows through the first bleaching stage D0 stage 112-1, to the second bleaching stage EOP stage 112-2, to the third bleaching stage D1 stage 112-3, to provide a bleached pulp output 120. Each of the bleaching stages 112 include respective devices (e.g., devices 114 described in FIG. 1) that can distribute (e.g., add dosages) oxidants, along with corresponding sensors (e.g., sensors 116) to measure characteristics of the pulp slurry as the pulp travels through the bleaching stages. The bleaching stages 112 also include corresponding control valves (e.g., control valves 118) to add caustics to the pulp slurry throughout the bleaching process 200.

The bleaching stages of bleaching process 200 are illustrated as the D0 stage 112-1, EOP stage 112-2, and D1 stage 112-3, in that order. The corresponding set of sensors of each bleaching stage provides sensor data to the delignification control 162. For example, sensors 116-1 provide sensor data 204-1 to the delignification control 162. The sensor data 204-1 can include measurements obtained between a starting point of the bleaching process 200 when the unbleached pulp slurry of pulp input 104 enters the first bleaching stage, D0 stage 112-1, and an addition point of the bleaching process 200 when oxidant dosage target 212-1 is added to the unbleached pulp slurry.

In more detail, the delignification control 162 receives a set of sensor data 204-1 from sensors 116-1 that can measure characteristics of unbleached pulp slurry from pulp input 104. The sensor data 204-1 can include measurements of the production rate for pulp input 104, such as the inlet stock flow and inlet stock consistency of the pulp slurry prior to the D0 stage 112-1. As an example, the sensor data 204-1 can include measurements for inlet stock flow that indicate the rate of flow between the source of pulp input 104 into the first stage DO, and measurements for inlet stock consistency indicating a relationship between the mass of the pulp and the mass of the suspension (e.g., usually water) that carries the pulp. In some implementations, one or more sensors from the sensors 116 are positioned inline with the pulp slurry as it progresses from one bleaching stage to the next bleaching stage. In some implementations, one or more sensors from the sensors 116 are positioned online, e.g., as sampling analyzers that connect to the flow of pulp slurry at a point. Sampling analyzers in sensors 116 can be configured to perform automatic sampling, e.g., collecting samples at a sampling rate.

In some examples, sensors 116 capture measurements of the amount of delignification by-products, e.g., black liquor and black liquor solids. By capturing measurements of delignification by-products, the delignification control 162 can adjust TEC dosage targets 210 to account for by-product and reduce waste. A reduction in by-product can also reduce wear and tear of other types of machinery found in pulp processing plants, such as evaporators and boilers. A reduction in by-product rate can also increase the rate of paper product output as more pulp can be processed by applying an optimal distribution of chemicals, e.g., compared to distributions that achieve slower chemical reactions due to inadequate combinations of chemicals being applied.

As the unbleached pulp slurry flows through the D0 stage 112-1, EOP stage 112-2, and D1 stage 112-3 in a bleaching process, different types of oxidants can be distributed although not all oxidants can be applied at every stage, e.g., of bleaching stages 112. For example, an oxidant such as oxygen may only be added in a stage, e.g., the EOP stage 112-2, to achieve a particular bleaching effect such as brightening the pulp slurry. As described, oxygen cannot be added in other stages, and so the delignification control 162 accounts for the type of oxidant applied and respective oxidant purpose when determining resource-efficient chemical distributions for optimal bleaching.

Prior to the D0 stage 112-1 bleaching (e.g., by applying oxidant dosage target 212-1) pulp slurry of the pulp input 104, the inlet kappa analyzer 106 provides an inlet kappa 202 to the delignification control 162 that indicates the kappa factor for unbleached pulp slurry. A target kappa 132 is also provided (e.g., by operator device 130) to the delignification control 162 prior to the first bleaching stage, D0 stage 112-1 applying an oxidant to the pulp input 104. The D0 stage 112-1 is an initial delignification stage where an oxidant can be added, e.g., as oxidant dosage target 212-1 to react with the lignin of the pulp slurry from pulp input 104. By adding oxidants to the pulp slurry, the D0 stage 112-1 generates chlorinated lignin compounds and other byproducts in the pulp slurry. As an example, some of the generated compounds can be washed away (e.g., by any device at any stage of the bleaching process 200). Alternatively, or in addition to washing away the compounds, caustics can be added to dissolve the compounds. For example, adding a caustic dosage target 214-1 from CTR control 168 can dissolve compounds generated by adding oxidant dosage 212-1 in the D0 stage 112-1. The caustic dosage target 214-1 can be added by an adjustment of control valve 118-1.

After the D0 stage 112-1 applies oxidant dosage target 212-1 to the pulp slurry and any an amount of caustic dosage target 214-1, the set of sensors 116-2 for the EOP stage 112-2 can provide sensor data 204-2 to delignification control 162. The sensor data 204-2 can include measurements obtained by sensors 116-2, e.g., flow meters to calculate weights of remaining oxidants and caustics in the pulp slurry as it enters the EOP stage 112-2. Sensor data from previous bleaching stages can help the delignification control 162 to adjust dosage targets (for both oxidants and caustics) at later bleaching stages.

The EOP stage 112-2 is an extraction stage to dissolve oxidized lignin (e.g., from DO stage 112-1) and remove the oxidized lignin from the pulp slurry. In some implementations, the EOP stage 112-2 applies oxidants such as oxygen and/or hydrogen peroxide with an amount for each oxidant based on oxidant dosage 212-2 (e.g., multiple targets corresponding to multiple oxidants). Oxygen and hydrogen peroxide can be added in the EOP stage 112-2 in particular, because among oxidants, oxygen and hydrogen peroxide are effective in brightening the pulp slurry (e.g., achieving the target kappa 132 by delignification control 162), after a first bleaching stage such as D0 stage 112-1. For example, the delignification control 162 can set an oxidant dosage target 212-2 for oxygen to a dosage (e.g., an amount of oxygen) that the pulp slurry can consume, while the oxidant dosage target 212-2 for hydrogen peroxide can be set such that fewer residual oxidants and no damage caused to the pulp strength of the pulp slurry throughout bleaching process 200.

The EOP stage 112-2 can also be used to re-activate the pulp, e.g., by removing insoluble organic acids formed in the D0 stage 112-1 and enable further oxidation of the lignin in the pulp slurry. For example, caustic dosage target 214-2 can be provided from CTR control 168 and added by EOP stage 112-2 by control valve 118-2 to react with insoluble organic acids to form salts that can be washed out of the pulp slurry. Controlling the pH of the pulp slurry at the EOP stage 112-2, by the caustic dosage target 214-2 and the control valve 118-2, can play an important role in the overall effectiveness of oxidants such as oxygen and hydrogen peroxide. Referring to the sensors 116-3A, the sensor data 204-3A can record measurements for pH that can be an indicator of the degree of reaction completion achieved in the EOP stage 112-2.

After the EOP stage 112-2 applies oxidant dosage target 212-2 to the pulp slurry, the sets of sensors 116-3A and sensors 116-3B can provide sensor data 204-3A and sensor data 204-3B to CTR control 168 and delignification control 162, respectively. For example, sensor data 204-3A provided to CTR control 168 can include measurements of remaining caustics in the pulp slurry as it exits the EOP stage 112-2 and enters the D1 stage 112-3. The sensor data 204-3B provided to delignification control 162 can similarly include measurements (e.g., as the pulp slurry exits the EOP stage 112-2 and enters the D1 stage 112-3) of remaining oxidants in the pulp slurry. As the pulp slurry exits the EOP stage 112-2 and enters the D1 stage 112-3, the D1 stage 112-3 can apply oxidant dosage target 212-3 to produce bleached pulp output 120. The D1 stage 112-3 is another delignification stage similar to D0 stage 112-1, in which oxidant dosage target 212-3 and caustic dosage target 214-3 can be added prior to producing bleached pulp output 120.

The set of sensor data 204-1, 204-2, 204-3A, and 204-3B captured at each of the bleaching stages 112 can be stored in sensor data storage 204-1-204-N (e.g., similar to sensor data 154) and can be provided to the delignification control 162. The sensor data storage 204-1-204-N can provide the sets of sensor data to TEC calculation 160 and to CTR control 168 to determine oxidant and caustic dosage targets, respectively.

For example, the TEC calculation 160 uses the sensor data to identify a TEC dosage 206 representing a current amount of total equivalent chlorine being provided in the bleaching process 200. The TEC calculation 160 provides the TEC dosage 206 to the delignification control 162, which can identify a TEC dosage target 210 based on the current TEC dosage 206, the target kappa 132, and the inlet kappa 202. The delignification control 162 can also utilize the sets of sensor data to adjust TEC dosage target 210 based on simulations of various scenarios (e.g., learning correction factors to improve accuracy of TEC calculation).

Upon determining TEC dosage target 210, the delignification control 162 can provide the TEC dosage target 210 to be achieved by the TEC control 164. The TEC control 164 provides dosages (e.g., amounts) and timing of dosages of oxidants through oxidant dosage targets 212-1-212-3 at respective stages of bleaching process 200 at multiple addition points, described in FIG. 4 further below. In some implementations, the TEC dosage 206 provided by the TEC calculation 160 is a predicted TEC dosage for upcoming bleaching stages, based on the sensor data from sensor data storage 204-1-204-N. As an example, the TEC dosage 206 can include a delayed TEC, to indicate a TEC factor to be achieved at a later point of bleaching process 200.

The TEC calculation 160 also uses the sensor data to identify a CTR target 208 to be achieved by CTR control 168, which determines dosages of caustics at various points of the bleaching process 200. For example, CTR control 168 can determine values for caustic dosage targets 214-1, 214-2, and 214-3, at the D0 stage 112-1, EOP stage 112-2, and D1 stage 112-3, respectively. The caustic dosage targets 214-1-214-3 can indicate an amount of caustic to be targeted, e.g., by the CTR control 168 adjusting control valves of the respective bleaching stage to add an amount of caustic to meet the respective caustic dosage target. The caustic dosage targets 214-1-214-3 can indicate a target amount of caustics to achieve an appropriate pH level for the bleached output product 120.

Figure 3:
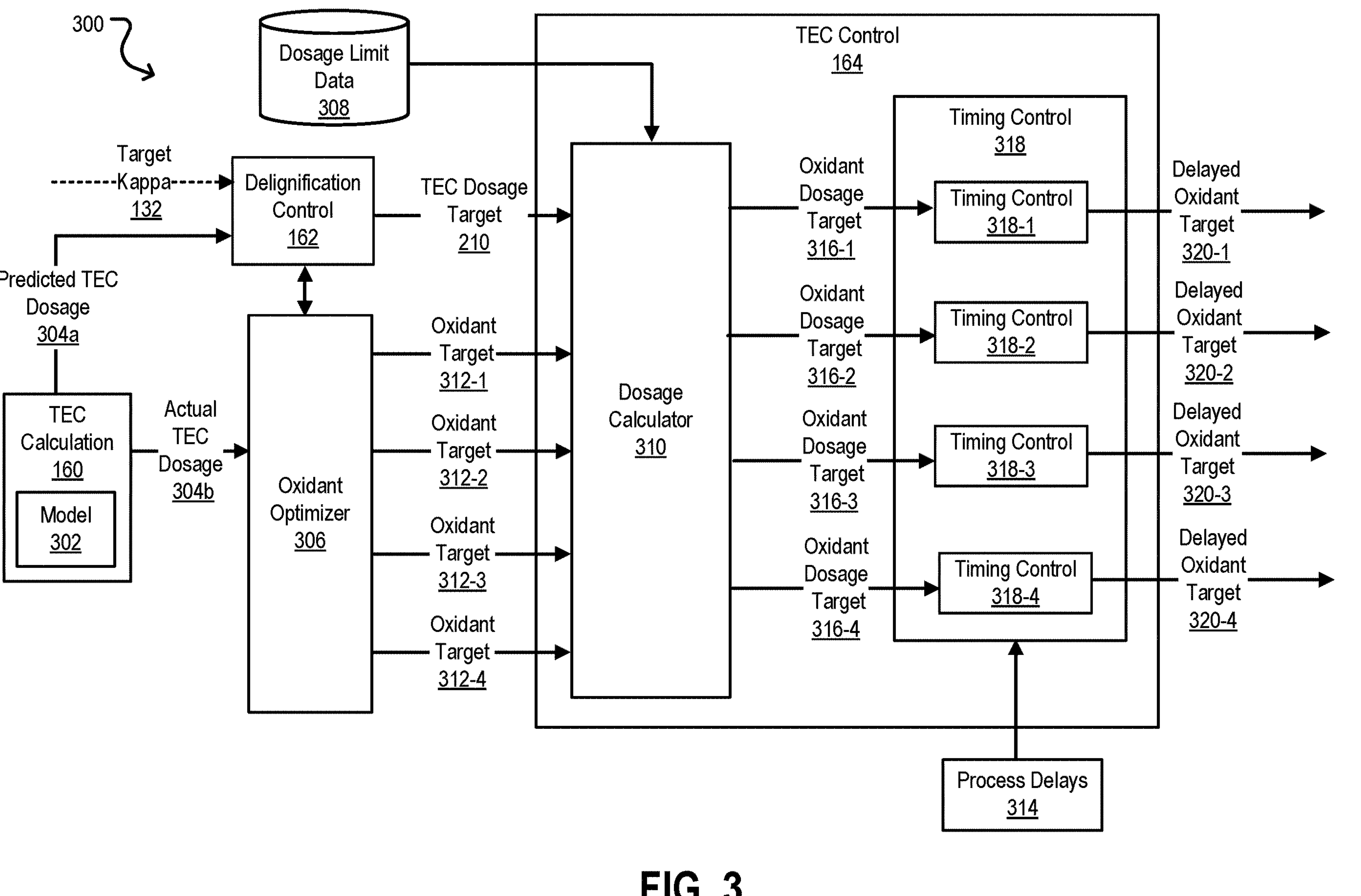
FIG. 3 is a block diagram an example scenario illustrating the determination of dosage targets for oxidizing agents based on the TEC factor.

FIG. 3 is a block diagram an example scenario 300 illustrating determination of dosage targets and timing for oxidizing agents. The scenario 300 illustrates the TEC calculation 160 providing a predicted TEC dosage 302 to delignification control 162 and an actual TEC dosage 304*b* to oxidant optimizer 306. The TEC calculation 160 includes a model 302 to learn relationships between kappa factors (e.g., series of kappa factors) and input kappa values (e.g., inlet kappa 202) and target kappa values (e.g., target kappa 132). For a given input kappa value and target kappa value, the model 302 can generate the predicted TEC dosage 304*a* for the delignification control 162 to use during scenario simulations. In some implementations, the model 302 can be a machine learning model (e.g., implementing machine learning techniques) or another appropriate statistical model.

The model 302 is configured to solve an optimization function that jointly maximizes delignification achieved for a given scenario and minimizes the resource consumption of different chemicals that are applied during the delignification process. By doing so, the model 302 can provide a predicted TEC dosage 304*a* for the delignification control 162 to implement in real-time based on constraints, e.g., for chemicals and equipment. The model 302 can identify a distribution of chemicals that achieves a target kappa as additional disturbances, e.g., kappa variations in the input pulp slurry, cause the model 302 to update dosages that maximizing delignification while simultaneously minimizing resource consumption. In some implementations, the model 302 leverage a rules-based approach to optimize predicted dosages across different scenarios. The model 302 can also be configured to analyze feedback, e.g., in the form of sensor data from sensor data storage 204, to adjust dosage amounts as sensor readings provide in-situ measurement of pulp slurry characteristics, e.g., kappa.

In the case of a machine learning model, the model 302 of TEC calculation 160 can be trained using known associations between input kappa values, target kappa values, and kappa factors. Once trained, model 302 can accept as input kappa values (e.g., by an inlet kappa analyzer 106) and target kappa values (e.g., target kappa 132) and output the corresponding kappa factors for a bleaching process (e.g., bleaching process 200). Such a model-based approach can be advantageous, particularly when stages of the bleaching process are complex, with numerous sources of variability (e.g., temperatures, chemical reaction rates, impurities). A person of ordinary skill in the art would understand that multiple other functions and/or models can be used to derive/determine the kappa factors for a bleaching process based on the associated input kappa values and target kappa values.

The delignification control 162 can run simulations using the predicted TEC dosage 304*a* and target kappa 132 to determine TEC dosage target 210 and generate total consumption scores, based on the dosage targets and delayed dosage targets determined in the scenario 300. Multiple scenarios similar to scenario 300 can be performed multiple times, with updated values for dosage targets and delayed dosage targets to achieve a lowest total consumption score.

As an example, Table 4 illustrates an example distribution of chemicals based on an optimization that minimizes chemicals according to environmental cost and chemical reaction rates, based on the current sensor measurements of the bleaching process 200. Updates to consumption and TEC can be illustrated, e.g., a reduction in the amount of $ClO_2$ and an increase in the amount of $H_2O_2$ to achieve a similar TEC.

TABLE 4

| Chemical | Consumption as TEC (kg/adt) | Actual TEC (kg/adt) | New Consumption as TEC (kg/adt) | Updated TEC (kg/adt) |
|---|---|---|---|---|
| $Cl_2$ | 0 | 0 | 0 | 0 |
| $ClO_2$ | 62.6 | 23.8 | 59.9 | 22.8 |
| $O_2$ | 53.3 | 12 | 53.2 | 12 |
| $H_2O_2$ | 5.64 | 2.7 | 8.36 | 4.0 |
| TOTAL | 121.5 | 38.5 | 121.46 | 38.8 |

Furthermore, the Kappa Factor (KF) as a percentage of TEC relative to the Kappa number of a pulp slurry be computed sequentially in simulations. For example, a Kappa measured as 27.2 for a pulp slurry with a first stage $ClO_2$ demonstrates 62.6 kg/adt of consumption with a corresponding percentage TEC of 6.3%, can result in a Kappa Factor of 6.3% divided by 27.2 or KF of 2.3. As delignification can be performed in a number of successive stages, a Sequential Kappa Factor (SKF) can be computed as a summation of all equivalent oxidants divided by incoming Kappa:

$$SKF = \frac{\%\ ClO_2 * TEC_{ClO_2} + \%\ O_2 * TEC_{O_2} + \%\ H_2O_2 * TEC_{H_2O_2}}{\text{Incoming Kappa Number}}$$

The delignification control 162 can run simulations to identify scenarios with a lowest total consumption score while maintaining the TEC dosage target 210, by adjusting individual dosage targets for oxidants. The delignification control 162 provides the TEC dosage target 210 a dosage calculator 310 of TEC Control 164, described further below.

In addition to the TEC dosage target 210, the TEC calculation 160 provides the actual TEC dosage 304*b* to oxidant optimizer 306. The actual TEC dosage 304*b* can include actual load shares of each oxidant used in a bleaching process (e.g., bleaching process 200) that can be measured by sensors throughout the bleaching process. Upon receiving the TEC dosage target 210, the oxidant optimizer 306 can determine oxidant targets 312-1-312-4 as percentages, e.g., the sum of oxidant targets 312-1-312-4 is equal to one hundred percent. Optimization of oxidants can be based on a factors such as environmental impact, cost, and overall reaction efficiency. For example, the oxidant optimizer 306 can optimize oxidant targets 312-1-312-4 based on the cost of the chemical per kilogram of the chemical applied. The oxidant optimizer 308 can reduce the usage of chemicals with harmful environmental impacts while maintaining an ideal TEC factor. As another example, the oxidant optimizer can determine ideal combinations of oxidants based on the actual load share percentages from TEC calculation 160, e.g., by sensors throughout the bleaching process that measure chemical weightings and determine load percentages.

In some implementations, the oxidant optimizer 306 selects oxidants based on environmental impact and/or chemical reaction efficiency. For example, the oxidant optimizer 306 can select a dosage for a first oxidant that maximizes chemical reaction efficiency for the respective first oxidant, e.g., a point in which a larger dosage of the first oxidant does not increase the efficiency, reaction rate, etc. of the chemical process beyond a threshold value. Subsequent oxidants can be selected according to the physical constraints of a respective oxidant. For example, particular distributions of one type of oxidants can undo the desired affects of another type of chemical, e.g., caustic agent, reducing agent. As an example, dosages of peroxide can be added until an equilibrium point is reached, but the dosage can be increased further to expedite the reaction. At a certain dosage, excess peroxide can result in decomposition of chlorine dioxide, e.g., moving away towards the target kappa for the pulp slurry.

As illustrated, oxidant targets 312-1-312-4 represent four unique oxidants, although any number of oxidants can be used. The oxidant targets 312-1-312-4 represent the target percentages of each oxidant to be distributed. In some implementations, any of the oxidants targets 312-1-312-4 can be nulled, e.g., the current load percentage of the oxidant is the target percentage and no further amount of oxidant is added. In some implementations, the oxidant optimizer 306 can read load share percentages of oxidants from one or more algorithms. For example, the load share percentages of oxidants can be dynamically determined and balanced by a load-balancing algorithm. Sensors can be used to determine the load share percentages of each oxidant, relative to a total distribution (e.g., weight, amount) of oxidants applied in a bleaching process. In some implementations, the oxidant target percentages 312-1-312-4 can be fixed values. The TEC calculator 160 can also perform a bumpless transfer (i.e., transferring between control modes without disrupting the bleaching process) by calculating actual load share percentages while adjusting the bleaching process between manual and automated operations.

The oxidant optimizer 306 provides the oxidant targets 312-1-312-4 to a dosage calculator 310 that computes oxidant dosage amounts from the percentages, based on the TEC dosage target 210 and dosage limit data 308. The dosage calculator 310 can determine corresponding oxidant dosage targets for each oxidant target, e.g., an amount of the oxidant corresponding to the targeted load share percentage of the oxidant. The dosage calculator 310 of the TEC control 164 generates oxidant dosage targets 316-1-316-4, which can be further processed to determine at which addition points of the bleaching process to add the oxidant dosage targets 316-1-316-4. As the TEC control 164 receives percentage contributions of each chemical's equivalent chlorine, the amounts of oxidants can be adjusted without the total TEC of a bleaching process.

The dosage calculator 310 receives the dosage limit data 308, which includes minimum and maximum values to ensure particular specifications or ratings for the pulp processing plant 102 are met. In some implementations, the dosage limit data 308 can be provided by an operator device 130. For example, a plant operator can specify certain dosage limits to meet environmental regulations or provide limits for the dosage calculator 310 to consider when computing dosages. The dosages can be refined and recomputed if a target exceeds a limit. As an example, minimum limits can be specified to ensure that dosages are non-negative numbers greater than or equal to zero. In some implementations, the dosage calculator 310 can re-compute dosages upon reaching dosage limits for one or more chemicals. For example, if some chemicals are limited (or are scarce), then the unused dosages of the chemicals can be added from other dosage targets. As another example, some chemicals can be limited such that overused dosages are reduced from other targets. The TEC control 164 applies limitations to dosages (e.g., oxidant dosages 316-1-316-4) prior to the dosages being processed by timing control 318.

Upon receiving oxidant dosages targets 316-1-316-4, the timing control 318 determines timing information for the dosages. Timing information can include adding delays to the distributions of oxidants, in which the delays can ensure an optimal application of the oxidants resulting in the lowest consumption score. Each oxidant 316-1-316-4 has a respective timing control 318-1-318-4, to generate a delayed oxidant target 320-1-320-4 based on process delays. In other words, data related to process delays 314 can be used to delay dosages to optimal positions in a bleaching process. These process delays 314 can include delays at each stage of the bleaching process and can be provided by the respective sensors 116. For example, the process delays 314 can include hysteresis in the production rate of the pulp processing plant 102 (e.g., provided by sensors 116-1 or inlet kappa analyzer 106)

The timing information determined by the timing control 318 of the TEC control 164 can provide that the oxidant dosage targets 316-1-316-4 can be precisely distributed at the determined addition points (e.g., further described in FIG. 4 below). Adding an oxidant too early or too late in a stage of the bleaching process can result in incomplete chemical reactions (e.g., residual reactants that cannot be used in a later bleaching stage or process) between the oxidant and the pulp slurry at the respective stage of the bleaching process. In some implementations, adding oxidants without appropriate timing can also result in inefficient chemical reactions, resulting in inadequate (e.g., too little) lignin removed from a pulp slurry. In some implementations, the timing control 318 applies a prediction algorithm for variable timing to provide moving averages based on the delay times. The timing control 318 can provide additional granularity in chemical distributions at the addition points, by gradually applying precise distributions of chemicals over periods of time that achieve the target kappa, e.g., through dosage targets.

Any number of timing controls can be used for a respective number oxidant targets. In some implementations, the timing control can determine that zero delay to optimally distribute the dosage of an oxidant. As an example, delayed oxidant target 320-1 can have the same timing as the oxidant dosage 316-1. Furthermore, any of the values in the bleaching process 200, e.g., values for TEC dosage target 210, oxidant targets 312-1-312-4, oxidant dosage targets 316-1-316-4, delayed oxidant target 320-1-320-4, and caustic dosage targets 212-1-212-4, can be provided in a visualization that is provided an operator. For example, the visualization can provide values, graphs, etc. and attributes of the bleaching process (e.g., inlet kappa 202, target kappa 132, predicted TEC dosage **304*a*, actual TEC dosage 304*b*, and TEC dosage target 210) to the operator. The visualization provided to the operator can include real-time estimations and measurements of these values. FIG. 4 is a block diagram illustrating a distribution of dosage targets for oxidizing agents from the example scenario 400 that has a lowest consumption score. The delignification control 162 (e.g., referring to FIGS. 1-3) can determine a scenario with the lowest consumption score, in which the TEC control 164 can distribute across multiple stages of a bleaching process. The bleaching process illustrated in example scenario 400 includes an unbleached pulp slurry from pulp input 104, to be processed through bleaching stages that include D0 stage 112-1, EOP stage 112-2, D1 stage 112-3, and an output stage 404 to produce a bleached pulp output 120. Caustic dosage targets 214-1-214-3 are illustrated as being applied by control valves 118-1-118-3, in which the dosage targets and instructions to apply the caustic at the dosage targets can be provided by a CTR control (e.g., CTR 168). A number of additional points 402-1-402-4 are illustrated to indicate a point in the bleaching process in which delayed oxidant targets 320-1-320-4** can be added to the bleaching process.

The TEC control 164 provides delayed oxidant targets 320-1-320-4 to corresponding addition points 402-1-402-4 of the illustrated bleaching process. As an example, the delayed oxidant target 320-1 can be added during a first bleaching stage, e.g., DO Stage 112-1 at the addition point 402-1. An oxidant (e.g., oxygen, chlorine dioxide, hydrogen peroxide) corresponding to delayed oxidant target 320-1 can be added at the addition point 402-1, in which the delay of the adding the oxidant by delayed oxidant target 320-1 at additional point 402-1 can provide a complete reaction (e.g., little to no residue) of oxidant. A complete reaction or improved reaction of an oxidant applied to a pulp slurry throughout a bleaching process can ensure that a precise amount of oxidant is distributed at a precise time. The distribution of delayed oxidant targets 320-1-320-4 at addition points 402-1-402-4 can provide faster reaction times than at other addition points of the bleaching process while maintaining a target kappa and TEC factor, resulting in bleached output 120. As another example, the distribution of delayed oxidant targets 320-1-320-4 at addition points 402-1-402-4 can provide consistency between numerous cycles of a bleaching process.

Figure 5:
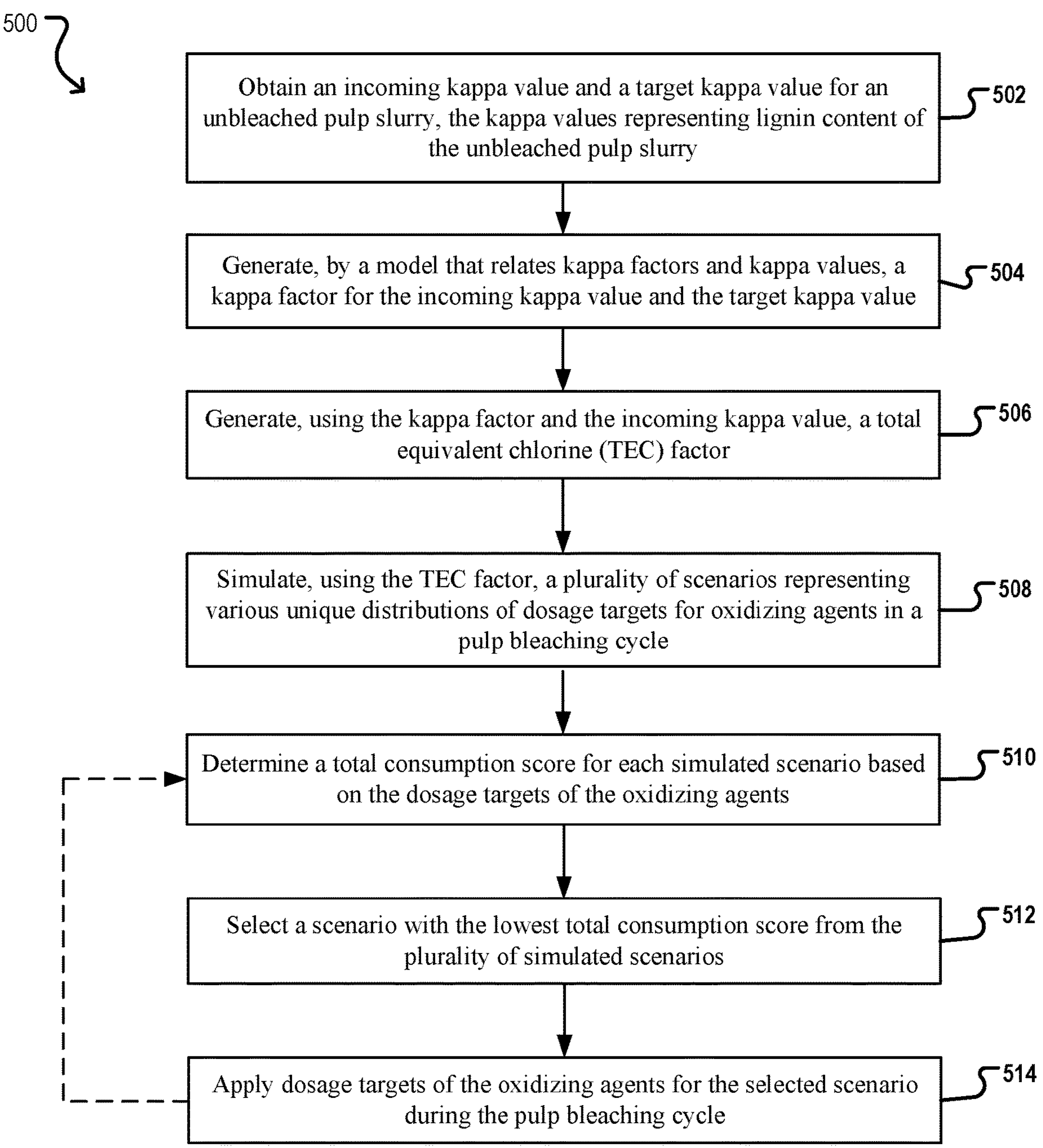
FIG. 5 is a flow chart of an example process for determining dosage targets for oxidizing agents of a pulp bleaching cycle of a manufacturing plant.

FIG. 5 is a flow chart of an example process 500 for determining dosage targets for oxidizing agents of a pulp bleaching cycle of a manufacturing plant. Operations of the process 500 can be implemented, for example, by the system components shown in FIGS. 1-4, and/or one or more data processing apparatus. In some implementations, operation of the process 500 can be implemented as instructions stored on a non-transitory computer readable medium, where execution of the instructions by one or more data processing apparatus cause the one or more data processing apparatus to perform operations of the process 500.

The delignification control 162 obtains an incoming kappa value and a target kappa value for an unbleached pulp slurry, the kappa values representing lignin content of the unbleached pulp slurry (502). For example, as described with reference to FIGS. 1 and 2, an inlet kappa analyzer is configured to measure lignin content of an unbleached pulp slurry prior to a bleaching cycle of the pulp input can obtain the incoming kappa value. An operator device can provide the target kappa value, e.g., a value based on targeted characteristics of the bleached pulp output. In some implementations, obtaining the target kappa value for a pulp slurry can include determining a kappa value for the pulp slurry from an immediately preceding pulp bleaching cycle. In some implementations, kappa sensors can determine the incoming and target kappa values.

The TEC calculation 160 generates, by a model that relates kappa factors and kappa values, a kappa factor for the incoming kappa value and the target kappa value (504). For example, as described with reference to FIG. 3, the TEC calculation 160 can use the model 302 that implements techniques such as machine learning or statistical testing to learn the relationship between an input kappa value and a target kappa value, to a kappa factor.

The TEC calculation 160 generate, using the kappa factor and the incoming kappa value, a total equivalent chlorine (TEC) factor (506). For example, as described with reference to FIG. 3, the TEC calculation can generate a predicted TEC dosage 304*a* and an actual TEC dosage 304*b* to be used by a simulator (e.g., by delignification control 162). The predicted TEC dosage 304*a* can be a TEC factor that represents the predicted bleaching power of stages in a bleaching process, based on amounts (e.g., load percentages) of oxidants being applied in the bleaching process. In some implementations, these oxidants can include chlorine dioxide, hydrogen peroxide, oxygen, ozone, and their respective allotropes.

The delignification control 162 simulates, using the TEC factor, a plurality of scenarios representing various unique distributions of dosage targets for oxidizing agents in a pulp bleaching cycle (508). As an example, as described with reference to FIGS. 1-3, the delignification control 162 can simulate multiple scenarios with various distributions of oxidants that maintain the TEC factor for a bleaching process and determine a TEC dosage target 210 that represents an amount of TEC dosage to be achieved. In some implementations, the delignification control 162 can be coupled to an oxidant optimizer 306 that can determine a number of oxidant targets, each oxidant target representing a target percentage for a particular oxidant.

The delignification control 162 determines a total consumption score for each simulated scenario based on the dosage targets of the oxidizing agents (510). For example, as described with reference to FIG. 3, The total consumption score can represent a distribution of the oxidants with respect to the TEC factor, with each oxidant having an associated cost (e.g., weighting of chemical consumed, financial cost, environmental cost). In some implementations, the total consumption score includes determining a total economic cost of the oxidizing agents used in the simulated scenario. In some implementations, the simulated scenario includes a determination of dosage targets for oxidizing agents performed in oxygen delignification stages of a bleaching process.

The delignification control 162 selects a scenario with the lowest total consumption score from the plurality of simulated scenarios (512). For example, as described with reference to FIG. 3, the delignification control 162 selects a scenario with the lowest total consumption score, based on an optimization parameter (e.g., cost).

The simulated scenario that is selected by the delignification control 162 can include time-shifted oxidant targets (e.g., delayed oxidant targets 320-1-320-4) determined by a TEC control 164. The time-shifted oxidant targets can be distributed at a number of addition points (e.g., addition points 402-1-402-4) of a pulp bleaching cycle. In some implementations, no time shift is added to the oxidant target. Furthermore, the time-shifted oxidant targets can be determined by timing controls that utilize dosage limits and process delays to identify appropriate time shifts for applying oxidant dosages.

The TEC control 164 applies dosage targets of the oxidizing agents for the selected scenario during the pulp bleaching cycle (514). Upon selecting the scenario, the TEC control 164 applies the time-shifted oxidant targets at the addition stages of a bleaching process. The output of the bleaching process includes a bleached pulp slurry with the particular target kappa, e.g., provided by an operator device to delignification control 162, regardless of variability of the inlet kappa value of the unbleached pulp input. In some implementations, sensor measurements can be utilized as feedback to step 510 and make a gain adjustment based on error measurements, the target kappa factor, and the brightness of the pulp slurry. In some implementations, applying the dosage targets of the oxidizing agents can include applying the dosage targets for a first oxidant in a first stage of a pulp bleaching cycle and applying dosage targets for a second oxidant in a second stage of the pulp bleaching cycle. For example, the first oxidant dosage target for chlorine dioxide can indicate an amount of chlorine dioxide to be applied during the first stage of the bleaching cycle. The second oxidant dosage targets for hydrogen peroxide and oxygen can indicate an amount of hydrogen peroxide and oxygen, respectively, to be applied during the second stage of the bleaching cycle.

In some implementations, the TEC calculation 160 determines a first kappa value of a pulp slurry after a second stage of a pulp bleaching cycle and assigns the first kappa value as a target kappa value for a next pulp bleaching cycle. In some implementations, the TEC control 164 applies the dosage targets of the oxidizing agents, such as chlorine dioxide, by controlling a first valve to release the dosage target for chlorine dioxide into the pulp slurry during the first stage of the pulp bleaching cycle. The TEC control 164 can also apply dosage targets of oxidizing agents such as hydrogen peroxide and oxygen during a second stage of the pulp bleaching cycle by controlling a second valve and a third valve, respectively.

In some implementations, obtaining the incoming and target kappa values includes determining incoming and target kappa values through sensors and sensor measurements. In some implementations, the model 302 is configured to determine the TEC factor by determining dosage targets for the oxidizing agents that maximizes delignification of the unbleached pulp slurry and minimize consumption of the plurality of oxidizing agents.

Figure 6:
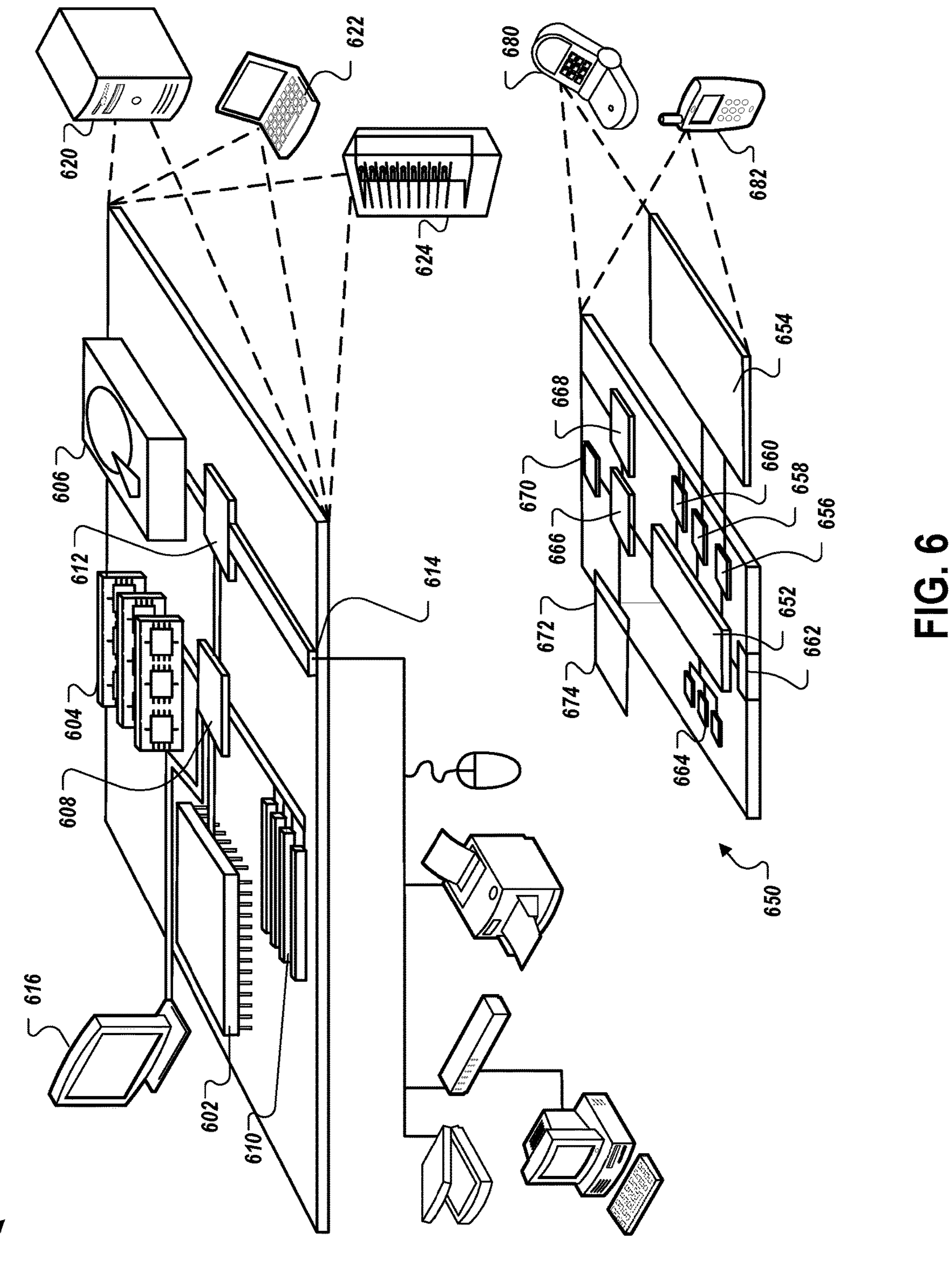
FIG. 6 is a block diagram of a computing system that can be used in connection with methods described in this specification.

FIG. 6 is a block diagram of computing devices 600, 650 that can be used to implement the systems and methods described in this document, either as a client or as a server or plurality of servers.

Computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smartphones, smartwatches, head-worn devices, and other similar computing devices. The components shown here, their connections and relationships, and their functions, are meant to be exemplary only, and are not meant to limit implementations described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a computer-readable medium. In one implementation, the memory 604 is a volatile memory unit or units. In another implementation, the memory 604 is a non-volatile memory unit or units.

The storage device 606 is capable of providing mass storage for the computing device 600. In one implementation, the storage device 606 is a computer-readable medium. In various different implementations, the storage device 606 may be a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 604, the storage device 606, or memory on processor 602.

The high-speed controller 608 manages bandwidth-intensive operations for the computing device 600, while the low speed controller 612 manages lower bandwidth-intensive operations. Such allocation of duties is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can process instructions for execution within the computing device 650, including instructions stored in the memory 664. The processor may also include separate analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD display or an OLED display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provided in communication with processor 652, to enable near area communication of device 650 with other devices. External interface 662 may provide, for example, for wired communication (e.g., via a docking procedure) or for wireless communication (e.g., via Bluetooth or other such technologies).

The memory 664 stores information within the computing device 650. In one implementation, the memory 664 is a computer-readable medium. In one implementation, the memory 664 is a volatile memory unit or units. In another implementation, the memory 664 is a non-volatile memory unit or units. Expansion memory 674 may also be provided and connected to device 650 through expansion interface 672, which may include, for example, a SIMM card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provided as a security module for device 650, and may be programmed with instructions that permit secure use of device 650. In addition, secure applications may be provided via the SIMM cards, along with additional information, such as placing identifying information on the SIMM card in a non-hackable manner.

The memory may include for example, flash memory and/or MRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, Wi-Fi, or other such transceiver (not shown). In addition, GPS receiver module 670 may provide additional wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smartphone 682, personal digital assistant, or other similar mobile device.

Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs, also known as programs, software, software applications or code, include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device, e.g., magnetic discs, optical disks, memory, Programmable Logic Devices (PLDs) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The systems and techniques described here can be implemented in a computing system that includes a back end component, e.g., as a data server, or that includes a middleware component such as an application server, or that includes a front end component such as a client computer having a graphical user interface or a Web browser through which a user can interact with an implementation of the systems and techniques described here, or any combination of such back end, middleware, or front end components. The components of the system can be interconnected by any form or medium of digital data communication such as, a communication network. Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

As used in this specification, the term "module" is intended to include, but is not limited to, one or more computers configured to execute one or more software programs that include program code that causes a processing unit(s)/device(s) of the computer to execute one or more functions. The term "computer" is intended to include any data processing or computing devices/systems, such as a desktop computer, a laptop computer, a mainframe computer, a personal digital assistant, a server, a handheld device, a smartphone, a tablet computer, an electronic reader, or any other electronic device able to process data.

A number of embodiments have been described. Nevertheless, it will be understood that various modifications may be made without departing from the spirit and scope of the invention. Accordingly, other embodiments are within the scope of the following claims. While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

The invention claimed is:

1. A computer implemented method, comprising:

obtaining (1) an incoming kappa value that represents a lignin content of an unbleached pulp slurry and (2) a target kappa value that represents an expected lignin content of a bleached pulp slurry;

generating, using a model, a sequence kappa factor corresponding to the incoming kappa value and the target kappa value, wherein the model maintains a relationship between a plurality of kappa factors and a plurality incoming and target kappa values;

generating, by the model, a total equivalent chlorine (TEC) factor according to the sequence kappa factor and the incoming kappa value;

simulating, using the TEC factor, a plurality of scenarios, wherein each scenario in the plurality of scenarios specifies a unique distribution of dosage targets for a plurality of oxidizing agents used during a pulp bleaching cycle;

determining, for each scenario and based on the dosage targets for the plurality of oxidizing agents corresponding to the scenario, a total consumption score for the plurality of oxidizing agents;

selecting, from among the plurality of simulated scenarios and based on the total consumption score determined for the plurality of simulated scenarios, a scenario with a lowest total consumption score; and applying, by the model, the dosage targets of the plurality of oxidizing agents for the selected scenario during the pulp bleaching cycle.

2. The computer-implemented method of claim 1, wherein obtaining the target kappa value includes determining a kappa value for a bleached pulp slurry from an immediately preceding pulp bleaching cycle.

3. The computer-implemented method of claim 1, wherein the plurality of oxidizing agents comprises chlorine dioxide, hydrogen peroxide, ozone and oxygen.

4. The computer-implemented method of claim 3, wherein applying the dosage targets of the plurality of oxidizing agents for the selected scenario during the pulp bleaching cycle, comprises:

applying the dosage target for chlorine dioxide during a first stage of the pulp bleaching cycle; and applying the dosage targets for hydrogen peroxide, ozone and oxygen during a second stage of the pulp bleaching cycle.

5. The computer-implemented method of claim 1, wherein determining the total consumption score of the plurality of oxidizing agents, comprises determining a total economic cost of the plurality of oxidizing agents.

6. The computer-implemented method of claim 4, further comprising:

determining a first kappa value of a bleached pulp slurry after the second stage of a pulp bleaching cycle; and assigning the first kappa value as a target kappa value for a next pulp bleaching cycle.

7. The computer-implemented method of claim 4, wherein applying the dosage targets of the plurality of oxidizing agents for the selected scenario during the pulp bleaching cycle, comprises:

controlling a first valve to release into the pulp slurry the dosage target for chlorine dioxide during the first stage of the pulp bleaching cycle; and controlling a second valve and a third valve to release the dosage targets for hydrogen peroxide and oxygen during the second stage of the pulp bleaching cycle.

8. The computer-implemented method of claim 2, wherein obtaining the incoming and target kappa values includes determining, using a plurality of kappa sensors, the incoming and target kappa values.

9. The computer-implemented method of claim 1, wherein the model is configured to determine the TEC factor by determining dosage targets for the plurality of oxidizing agents that maximizes delignification of the unbleached pulp slurry and minimize consumption of the plurality of oxidizing agents.

10. A system, comprising:

one or more memory devices storing instructions; and one or more data processing apparatus that are configured to interact with the one or more memory devices, and upon execution of the instructions, perform operations including:

obtaining (1) an incoming kappa value that represents a lignin content of an unbleached pulp slurry and (2) a target kappa value that represents an expected lignin content of a bleached pulp slurry;

generating, using a model, a sequence kappa factor corresponding to the incoming kappa value and the target kappa value, wherein the model maintains a relationship between a plurality of kappa factors and a plurality incoming and target kappa values;

generating, by the model, a total equivalent chlorine (TEC) factor according to the sequence kappa factor and the incoming kappa value;

simulating, using the TEC factor, a plurality of scenarios, wherein each scenario in the plurality of scenarios specifies a unique distribution of dosage targets for a plurality of oxidizing agents used during a pulp bleaching cycle;

determining, for each scenario and based on the dosage targets for the plurality oxidizing agents corresponding to the scenario, a total consumption score for the plurality of oxidizing agents;

selecting, from among the plurality of simulated scenarios and based on the total consumption score determined for the plurality of simulated scenarios, a scenario with a lowest total consumption score; and applying, by the model, the dosage targets of the plurality of oxidizing agents for the selected scenario during the pulp bleaching cycle.

11. The system of claim 10, wherein obtaining the target kappa value includes determining a kappa value for a bleached pulp slurry from an immediately preceding pulp bleaching cycle.

12. The system of claim 10, wherein the plurality of oxidizing agents comprise chlorine dioxide, hydrogen peroxide, ozone and oxygen, and wherein applying the dosage targets of the plurality of oxidizing agents for the selected scenario during the pulp bleaching cycle, comprises:

applying the dosage target for chlorine dioxide during a first stage of the pulp bleaching cycle; and applying the dosage targets for hydrogen peroxide and oxygen during a second stage of the pulp bleaching cycle.

13. The system of claim 12, further comprising:

determining a first kappa value of a bleached pulp slurry after the second stage of a pulp bleaching cycle; and assigning the first kappa value as a target kappa value for a next pulp bleaching cycle.

14. The system of claim 13, wherein applying the dosage targets of the plurality of oxidizing agents for the selected scenario during the pulp bleaching cycle, comprises:

controlling a first valve to release into the pulp slurry the dosage target for chlorine dioxide during the first stage of the pulp bleaching cycle; and controlling a second valve and a third valve to release the dosage targets for hydrogen peroxide, ozone and oxygen during the second stage of the pulp bleaching cycle.

15. The system of claim 10, wherein obtaining the incoming and target kappa values includes determining, using a plurality of kappa sensors, the incoming and target kappa values.

16. The system of claim 10, wherein the model is configured to determine the TEC factor by determining dosage targets for the plurality of oxidizing agents that maximizes delignification of the unbleached pulp slurry and minimize consumption of the plurality of oxidizing agents.

17. A non-transitory computer readable medium storing instructions that, when executed by one or more data processing apparatus, cause the one or more data processing apparatus to perform operations comprising:

obtaining (1) an incoming kappa value that represents a lignin content of an unbleached pulp slurry and (2) a target kappa value that represents an expected lignin content of a bleached pulp slurry;

generating, using a model, a sequence kappa factor corresponding to the incoming kappa value and the target kappa value, wherein the model maintains a relationship between a plurality of kappa factors and a plurality incoming and target kappa values;

generating, by the model, a total equivalent chlorine (TEC) factor according to the sequence kappa factor and the incoming kappa value;

simulating, using the TEC factor, a plurality of scenarios, wherein each scenario in the plurality of scenarios specifies a unique distribution of dosage targets for a plurality of oxidizing agents used during a pulp bleaching cycle;

determining, for each scenario and based on the dosage targets for the plurality oxidizing agents corresponding to the scenario, a total consumption score for the plurality of oxidizing agents;

selecting, from among the plurality of simulated scenarios and based on the total consumption score determined for the plurality of simulated scenarios, a scenario with a lowest total consumption score; and applying, by the model, the dosage targets of the plurality of oxidizing agents for the selected scenario during the pulp bleaching cycle.

18. The non-transitory computer readable medium of claim 17, wherein the model is configured to determine the TEC factor by determining dosage targets for the plurality of oxidizing agents that maximizes delignification of the unbleached pulp slurry and minimize consumption of the plurality of oxidizing agents.

19. The non-transitory computer readable medium of claim 17, wherein the plurality of oxidizing agents comprise chlorine dioxide, hydrogen peroxide, ozone and oxygen, and wherein applying the dosage targets of the plurality of oxidizing agents for the selected scenario during the pulp bleaching cycle comprises:

applying the dosage target for chlorine dioxide during a first stage of the pulp bleaching cycle; and applying the dosage targets for hydrogen peroxide and oxygen during a second stage of the pulp bleaching cycle.

20. The non-transitory computer readable medium of claim 19, wherein applying the dosage targets of the plurality of oxidizing agents for the selected scenario during the pulp bleaching cycle, comprises:

controlling a first valve to release into the pulp slurry the dosage target for chlorine dioxide during the first stage of the pulp bleaching cycle; and controlling a second valve and a third valve to release the dosage targets for hydrogen peroxide, ozone and oxygen during the second stage of the pulp bleaching cycle.

* * * * *